United States Patent [19]

Russ et al.

[11] 3,755,016

[45] Aug. 28, 1973

[54] DIFFUSION PROCESS FOR COMPOUND SEMICONDUCTORS

[75] Inventors: Malcolm J. Russ, Scottsdale; Edwin Coats, Phoenix, both of Ariz.

[73] Assignee: Motorola, Inc., Franklin Park, Ill.

[22] Filed: Mar. 20, 1972

[21] Appl. No.: 236,012

[52] U.S. Cl. .................. 148/189, 148/187, 148/186, 148/190, 252/62.3 GA

[51] Int. Cl. .................. H01l 7/44

[58] Field of Search .................. 148/189, 190, 187, 148/171, 172; 252/62.3 GA

[56] References Cited

UNITED STATES PATENTS

| | | | |
|---|---|---|---|
| 3,298,879 | 1/1967 | Scott et al. | 148/187 |
| 3,617,929 | 11/1971 | Strack et al. | 317/235 N |
| 3,215,571 | 11/1965 | Frieser | 148/189 |
| 3,669,767 | 6/1972 | Hackett et al. | 148/171 |
| 3,158,512 | 11/1964 | Nelson et al. | 148/172 X |

*Primary Examiner*—G. I. Ozaki

*Attorney*—Vincent J. Rauner and Henry T. Olsen

[57] ABSTRACT

There is disclosed a method of manufacturing compound semiconductor devices under ambient pressure conditions. The process includes heating a source of dopant material selected from the group consisting of the II–VI compounds and III–V compounds together with a semiconductor substrate selected from the group consisting of III–V compounds and II–VI compounds to a predetermined temperature while passing an inert gas, preferably nitrogen, thereover. Thereafter forming gas (95 percent $N_2$ – 5 percent $H_2$) is passed over the source material and the substrate to effect reduction of the source material; a deposition of dopant ions on the semiconductor substrate; and diffusion of the dopant ions therein. In accordance with preferred embodiment of the invention linc oxide is used as the source material for substrates of GaAs, $GaAs_xP_{1-x}$ and GaP. The process permits the use of a single temperature operation for deposition and diffusion. The donor ions present in the source material do not diffuse readily enough into the compound semiconductor substrates to affect the doping concentration provided by the acceptor ions.

6 Claims, 2 Drawing Figures

DIFFUSION PROCESS FOR COMPOUND SEMICONDUCTORS

BACKGROUND OF THE INVENTION

Figure 1:
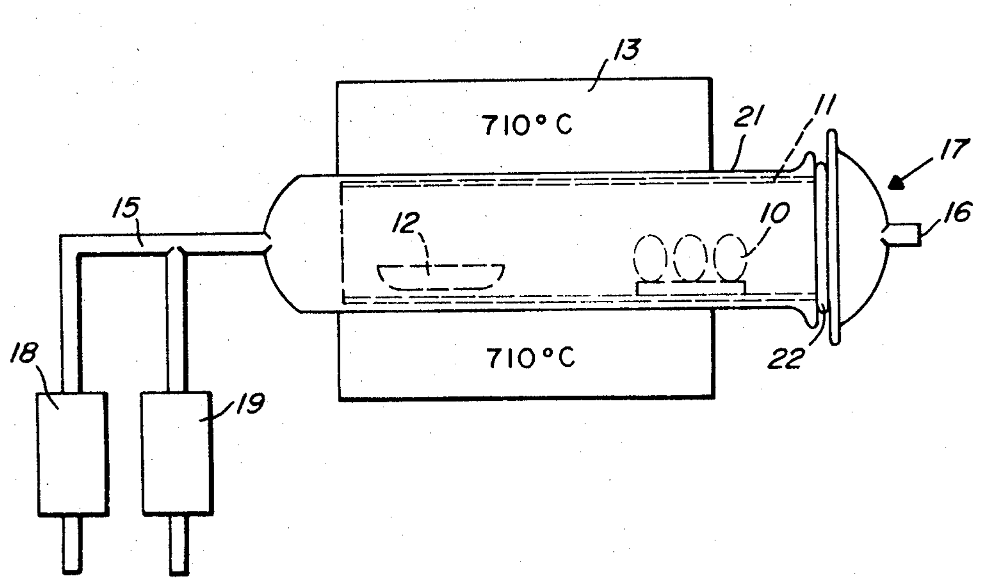

This invention relates to semiconductor device manufacture and more particularly to a process for the production of semiconductor devices from III–V or II–VI material.

Semiconductor devices of III–V and II–VI compound material have been previously suggested for use in manufacturing various semiconductor structures such as diodes and transistors. More recently, compounds of this type have been found useful for semiconductor devices such as light emitting diodes, photodiodes and phototransistors. As is well known, in doping III–V materials, Group II elements form acceptor ions and Group VI materials form donor ions. Similarly, for doping II–VI compounds, Group III elements and Group V elements may be used. Particularly, compound semiconductors of G*a*A*s*, G*a*A*s*P, and G*a*P have been manufactured for use as light emitting diodes wherein an acceptor ion of zinc or cadmium is diffused into the body material to form the PN junction diode. Since it was thought to ke not beneficial to perform deposition and diffusion of II–VI or III–V compounds in the presence of compositions which would provide both acceptor and donor ions, the doping materials have been of elemental sources or sources not including the counterpart acceptor or donor ions, such as II–V or III–VI compounds. In some cases, where the diffusion was from a source containing both the acceptor and donor ions, attempts were made to diffuse very rapidly at high temperatures to increase the effective difference in diffusion coefficient between the elements forming the source composition. Such use of high temperatures affects the crystalline structure of the semiconductor substrate and leads to a profusion of bad defects.

SUMMARY OF THE INVENTION

It is an object of this invention to provide a method of manufacturing compound semiconductor devices which can be accomplished at atmospheric pressure and at relatively low temperature.

It is a further object of the invention to provide a method of manufacturing compound semiconductor devices which include as its source material a compound of acceptor and donor ions for the body of the semiconductor material.

A still further object of the invention is to provide a method of manufacturing light emitting diodes in a semiconductor material selected from the group consisting of GaAs, $GaAs_xP_{1-x}$, and G*a*P by diffusing acceptor ions from compound materials selected from the group consisting of zinc and cadmium with oxygen, sulfphur, selenium, and tellurium.

In accordance with the foregoing there is provided a method of manufacturing semiconductor devices comprising the steps of heating a dopant source of a material selected from the group consisting of II–VI and III–V compounds together with a masked semiconductor substrate selected from the group consisting of III–V and II–VI compounds to a predetermined temperature while passing an inert gas thereover; and then passing a forming gas over said source material and said substrate while maintaining said temperature for a period of time sufficient to diffuse a dopant ion into the unmasked portion of the substrate.

THE DRAWINGS

Figure 2:
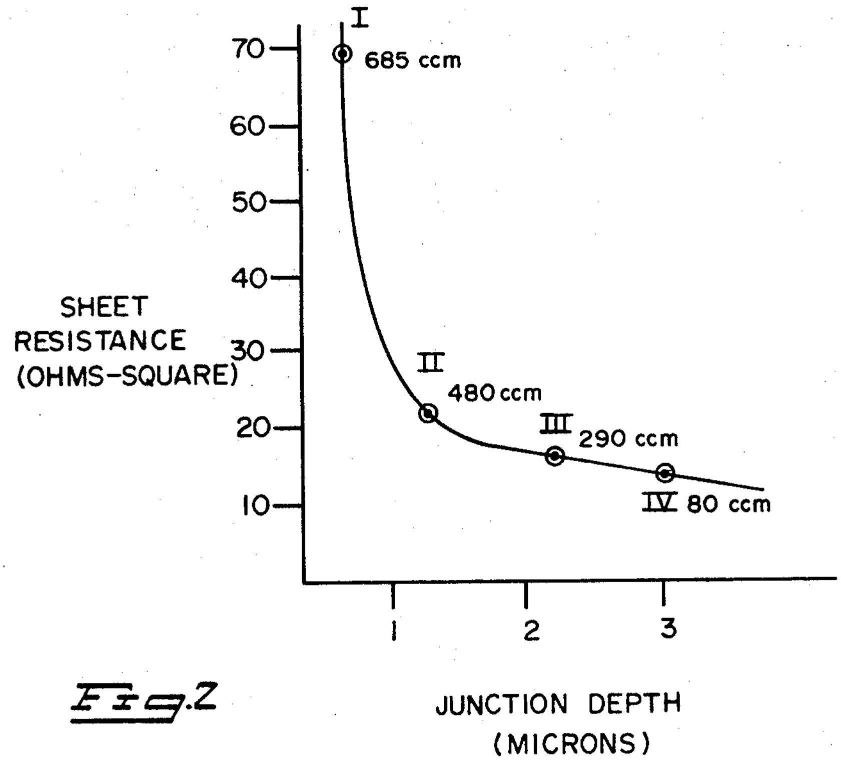

Further objects and advantages of the invention will be understood from the following complete description thereof and from the drawings wherein:

FIG. 1 is a schematic representation of apparatus suitable for carrying out the process: and FIG. 2 is a graph of diffusion results from the process.

COMPLETE DESCRIPTION

In the process of depositing doping ions on semiconductor substrates of silicon, germanium, II–VI compounds and III–V compounds and diffusing the ions therein, several alternative processes have been previously suggested. Various source materials, temperatures, pressures, times and other conditions have been suggested each leading to solutions which perhaps are successful for one purpose but unsatisfactory for other purposes. For example, in one suggested process relating to diffusion into silicon, use of gallium and arsenic trioxides and similar materials are utilized to simultaneously diffuse N and P type impurities into semiconductors. However, such a process as applied to II–VI and III–V materials would be unsatisfactory since the foregoing process assumes a chemical reduction of the trioxides by the gas carrier during the diffusion process. Thus, if applied to a II—VI or III–V material, the same oxidation or reduction would take place with resultant volatilization of the semiconductor substrate per se and leading to various defective structures. Another process, relating specifically to germanium, requires deposition of the diffusion source on the substrates and then controls the relative diffusion from one or two such layers by manipulation of the reduction/oxidation conditions of the ambient gas materials. Such a process as applied to II–VI or III–V materials is unsatisfactory, since insufficient diffusion of the doping ions is obtained by diffusion at moderate temperatures and at the higher temperatures suggested the surface of the semiconductor body becomes damaged resulting in defective structures. It has also been suggested that the deposition and diffusion take place from a compound of the doping material and one of the constituents of the compound semiconductor substrate. For example, if zinc were to be diffused into a gallium arsenide semiconductor body, a source of zinc could be $ZnAs_2$ or $Zn_3As_2$. These processes again result in damage to the wafer surface, perhaps because of the excess activity of the source material and the lower concentration of dopant.

In carrying out the method of the present invention apparatus such as schematically represented in FIG. 1 may be used. In general, a group of masked wafers 10 of the selected compound semiconductor material are placed in an enclosure 11 with a source 12 containing an impurity to be diffused into the wafers. Heating means 13 may surround the enclosure 11 thus providing a mechanism for heating the enclosure to its desired predetermined temperature between 650° and 750° C and maintaining the chamber and its contents at the desired temperature during the deposition and diffusion process. An inlet 15, normally adjacent the source 12 of the impurity material, is provided at one end of the enclosure while an outlet, or vent, 16 is provided at the other end. Normally the venting end of the enclosure is provided with a removable closure 17 which permits loading and unloading of the enclosure 11. Flowmeter sources 18 and 19 for an inert gas and forming gas, respectively, are provided connected to the inlet 15. If other materials are to be utilized during the processing it will be appreciated further flowmeter tubes may be provided. The gas stream though the inlet 15 is controllable by the flow meter sources 18 and 19 in accordance with a predetermined desired schedule so as to properly control the diffusion of the impurities into the wafers 10.

The enclosure 11 is heated to a predetermined desired temperature while an inert gas normally nitrogen is provided through inlet 15 to the enclosure. The inert gas picks up a certain amount of source material vaporized from the source 12 and deposits the unreduced source material on the wafers 11. Following this an inert gas treatment, the inert gas is turned off and forming gas which is 95 percent nitrogen and 5 percent hydrogen is introduced. The source material is continued to be deposited upon the semiconductor wafers but because of the reducing atmosphere of the forming gas, the acceptor constituent of the source material is deposited and then diffused into the unmasked portion of the wafers 10.

The enclosure 11 preferably is a quartz diffusion tube which is inserted into an opening into the furnace 13. The closure member 17 preferably includes a tubular section 21 and an O ring seal 22. Thus the source material 12 and the wafers 10 may be placed in suitable receptacles within the tubular extension 21 of the closure member 17. The closure member 17 may then be introduced into the quartz tube enclosure 11 and sealed by the O ring 22.

EXAMPLE I

In accordance with preferred embodiment of the invention a plurality of gallium arsenide phosphide wafers suitably masked to provide diffusion regions in selected areas thereof are loaded into a receptacle and placed within the closure member 17. Approximately 10 grams of reagent grade zinc oxide is placed in the source receptacle and also placed in the closure member. The furnace meanwhile is preheated to 720° C and purged by nitrogen flow at approximately 5,000 cubic centimeters per minute. The closure member is then inserted and sealed into the quartz tube enclosure and the nitrogen flow reduced to about 600 cc/min for 30 minutes. At the end of the 30 minute period the nitrogen flow is turned off and the forming gas (5 percent hydrogen, 95 percent nitrogen) is passed through at a volume of 685 cubic centimeters per minute for a period of 3 hours. The forming gas is then turned off and the tube purged with nitrogen for a short period of time after which the closure member 17 with the substrates may be withdrawn. The surfaces of the wafers did not show observable crazing. After removal of a superficial deposit of zinc oxide on the substrate with a hydrofluoric etch or a hydrofluoric acid scrub, the devices were tested and found to have a sheet resistance in the area of diffusions of approximately 70 ohms per square with a relatively shallow junction depth of approximately 1 micron (FIG. 2).

EXAMPLE II

In accordance with the same procedure as followed in Example 1, three groups of masked substrates were treated exactly as above with the exception that the forming gas flowed at a volume of 480 cubic centimeters per minute. Under these conditions the groups of substrates were found to have a sheet resistance of between 20 to 30 ohms per square with junction depths of approximately 1.5 to 2.2 microns (FIG. 2).

EXAMPLE III

Substrates of Group III were treated as above with a flow rate of forming gas at 290 cc/min. Under this condition, the substrates were found to have a sheet resistance of approximately 18 ohms per wquare with a junction depth of approximately 2.2 microns.

EXAMPLE IV

With the same conditions as above the Group IV substrates were treated with a flow rate of forming gas at 80 cc/min and found to have a sheet resistance of apporximately 15 ohms per square with a junction depth of approximately 3 microns.

The substrates in the above examples had surfaces which were substantially defect free.

It will thus be seen that in accordance with the invention there is provided a method of depositing and diffusing acceptor dopants into II-VI AND III-V compounds from sources which contain both acceptor and donor ions. While the invention has been disclosed by way of the preferred embodiment thereof it will be appreciated that suitable modifications may be made therein without departing from the spirit and scope of the invention.

What is claimed is:

1. A method of manufacturing compound semiconductor devices comprising the steps of heating a dopant source of a material selected from the group consisting of Group II–VI and III–V compounds together with a masked semiconductor substrate selected from the group consisting of Group III–V and II–VI compounds to a predetermined temperature while passing an inert gas thereover and then passing a forming gas over said source material and said substrate while maintaining said temperature for a period of time sufficient to diffuse an acceptor dopant ion into the unmasked portion of the substrate.

2. A method of manufacturing compound semiconductor devices as recited in claim 1 wherein said substrate is of a material selected from the group consisting of gallium arsenide, gallium arsenide phosphide, and gallium phosphide and the dopant source of a compound selected from the group of compounds consisting of zinc and cadmium with oxygen, sulphur, selenium, and tellurium.

3. A method of manufacturing compound semiconductor devices as recited in claim 2 wherein said predetermined temperature is between 650° and 750° C.

4. A method of manufacturing compound semiconductor devices as recited in claim 3 wherein said predetermined temperature is approximately 710° C.

5. A method of manufacturing compound semiconductor devices as recited in claim 2 wherein said step of preheating is continued for approximately 30 minutes and the step of passing forming gas over the material is continued for approximately 3 hours.

6. A method of manufacturing compound semiconductor devices as recited in claim 2 wherein said substrate is gallium arsenide phosphide and the dopant source is zinc oxide.

* * * * *